United States Patent [19]

Choi

[11] Patent Number: 5,722,268
[45] Date of Patent: Mar. 3, 1998

[54] BURGLAR-PROOFING DEVICE FOR A PERSONAL COMPUTER

[75] Inventor: Phil-Kyu Choi, Suwon-si, Rep. of Korea

[73] Assignee: SamSung Electronics Co., Ltd., Kyungki-do, Rep. of Korea

[21] Appl. No.: 636,645

[22] Filed: Apr. 23, 1996

[30] Foreign Application Priority Data

Apr. 24, 1995 [KR] Rep. of Korea .................. 8333/1995

[51] Int. Cl.⁶ .................................................. E05B 69/00
[52] U.S. Cl. ............................. 70/58; 248/553; 70/57; 70/232
[58] Field of Search ..................... 70/2, 14, 18, 57, 70/58, 158–169, 232; 411/910; 248/551–553

[56] References Cited

U.S. PATENT DOCUMENTS

| | | | |
|---|---|---|---|
| 1,707,225 | 4/1929 | Jackson | 70/57 X |
| 1,810,305 | 6/1931 | Tracy et al. | 70/57 X |
| 2,930,218 | 3/1960 | Ashmore | 70/232 X |
| 3,782,146 | 1/1974 | Franke | 70/232 |
| 4,125,241 | 11/1978 | Moore, Jr. | 70/2 X |
| 4,290,284 | 9/1981 | Nicksic | 70/232 X |
| 4,300,373 | 11/1981 | Camos et al. | 70/232 |
| 4,438,642 | 3/1984 | De Jong | 70/232 |
| 4,584,856 | 4/1986 | Petersdorff et al. | 70/57 |
| 4,585,202 | 4/1986 | Parsekian | 248/553 |
| 4,777,812 | 10/1988 | Haugen | 70/57 X |
| 5,050,836 | 9/1991 | Makous | 248/553 |
| 5,184,798 | 2/1993 | Wilson | 248/551 |
| 5,406,809 | 4/1995 | Igelmund | 70/58 X |
| 5,447,044 | 9/1995 | Cheng | 70/58 |
| 5,447,045 | 9/1995 | Cheng | 70/58 |
| 5,456,443 | 10/1995 | Taaffe | 248/551 |
| 5,502,989 | 4/1996 | Murray, Jr. et al. | 248/551 X |

*Primary Examiner*—Suzanne Dino
*Attorney, Agent, or Firm*—Robert E. Bushnell, Esq.

[57] ABSTRACT

A burglar-proofing device for a computer includes a rear panel having a first pair of grooves and a hole formed therein, and a cover having a second pair of grooves and a fastening receptacle formed therein. A ring screw having a fastening portion formed on a first end and a projecting portion formed on a second end positioned opposite the first end is provided so that the fastening portion is connected within the fastening receptacle when the computer is in an assembled state. A bracket having a slot formed in a center portion and first and second arms extending outwardly from the center portion is provided so that the first arm is inserted through a first one of the first pair of grooves and a first one of the second pair of grooves, the second arm is inserted through a second one of the first pair of grooves and a second one of the second pair of grooves and the projecting portion is inserted through the slot when the computer is in the assembled state. A lock having a latching arm that is insertable through a latching hole formed in the projecting portion of the ring screw is provided for securing the computer in the assembled state.

7 Claims, 4 Drawing Sheets

BURGLAR-PROOFING DEVICE FOR A PERSONAL COMPUTER

CROSS-REFERENCE TO RELATED APPLICATIONS

This application makes reference to, incorporates the same herein, and claims all benefits accruing under 35 U.S.C. §119 arising from an application for Burglar-Proofing Device For A Personal Computer earlier filed in the Korean Industrial Property Office on 24 Apr. 1995 and there duly assigned Ser. No. 8333/1995.

BACKGROUND OF THE INVENTION

The present invention relates to a burglar-proofing device for a personal computer (PC), and more particularly, to a burglar-proofing device for a personal computer which prevents theft of the computer's internal parts and movement of the computer by using a novel locking configuration.

As personal computers have become increasingly functional, their internal components have become increasingly expensive. As a result, theft of these internal components has been on the rise. While this type of thievery is clearly a burden to individual computer owners, it is especially burdensome to firms and technical laboratories that typically employ large numbers of computers. In view of this problem, demands for a burglar-proofing device for a personal computer have been expressed.

SUMMARY OF THE INVENTION

Accordingly, it is an object of the present invention to solve the above-mentioned problem by providing a burglar-proofing device for a personal computer.

It is another object to provide a burglar-proofing device for a personal computer that prevents theft of the computer's internal components.

It is still another object to provide a burglar-proofing device for a personal computer that prevents movement of the computer.

It is yet another object to provide a burglar-proofing device for a personal computer that utilizes a novel locking configuration.

To achieve these and other objects, the present invention contemplates a burglar-proofing device for a computer, including a rear panel having a first pair of grooves and a hole formed therein, and a cover having a second pair of grooves and a fastening receptacle formed therein. A ring screw having a fastening portion formed on a first end and a projecting portion formed on a second end positioned opposite the first end is provided so that the fastening portion is connected within the fastening receptacle when the computer is in an assembled state. A bracket having a slot formed in a center portion and first and second arms extending outwardly from the center portion is provided so that the first arm is inserted through a first one of the first pair of grooves and a first one of the second pair of grooves, the second arm is inserted through a second one of the first pair of grooves and a second one of the second pair of grooves and the projecting portion is inserted through the slot when the computer is in the assembled state. A lock having a latching arm that is insertable through a latching hole formed in the projecting portion of the ring screw is provided for securing the computer in the assembled state.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
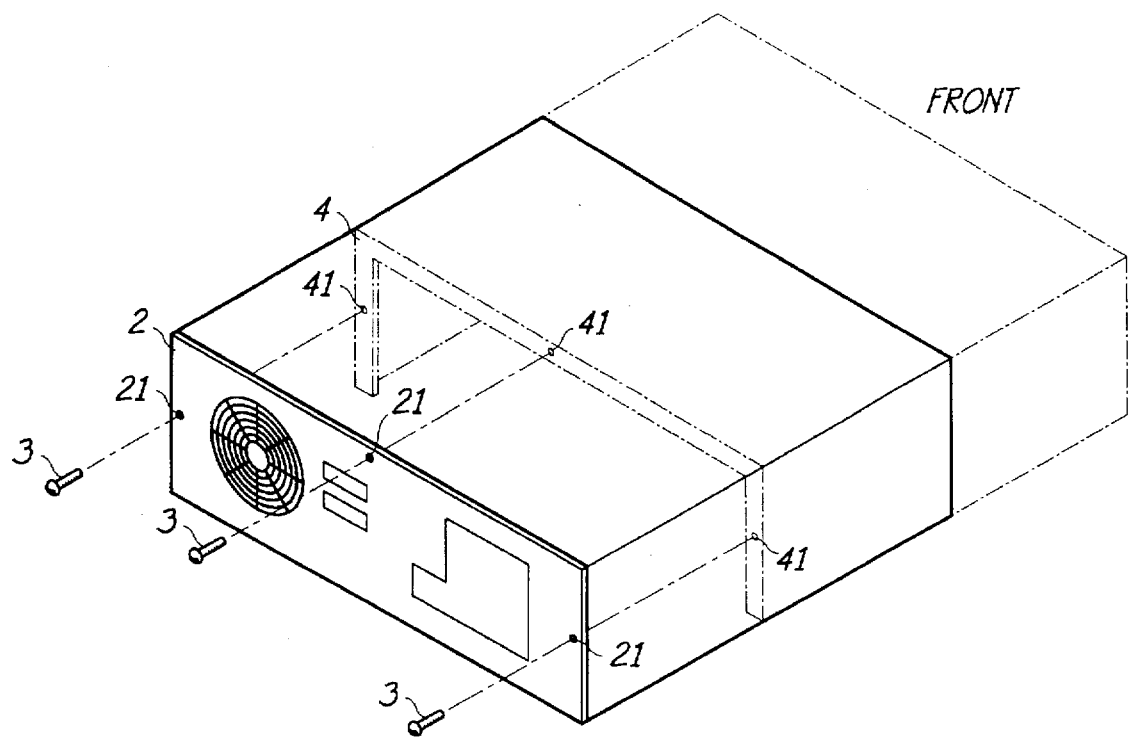
FIG. 1 illustrates the configuration of a conventional burglar-proofing device for a personal computer.
Figure 2:
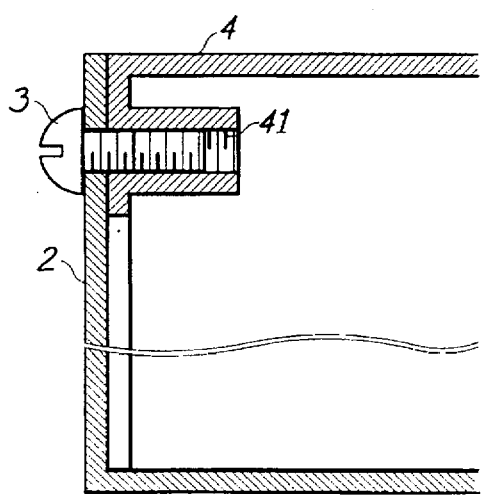
FIG. 2 illustrates a cross-sectional view of the conventional burglar-proofing device of FIG. 1.

Turning now to the drawings and referring to FIG. 1, the configuration of a conventional burglar-proofing device for a personal computer is illustrated. FIG. 2 illustrates a cross-sectional view of the conventional burglar-proofing device of FIG. 1. The conventional burglar-proofing device for a personal computer will now be explained with reference to FIGS. 1 and 2.

As shown in FIG. 1, a computer cover 4 having a plurality of screw grooves 41 formed therein is connectable to a rear panel 2 of a bottom case of a computer. Rear panel 2 has a plurality of holes 21 formed therein at positions corresponding to the screw grooves 41 formed in computer cover 4. During assembly, computer cover 4 is placed against rear panel 2 so that the holes 21 formed in rear panel 2 are aligned with the screw grooves 41 formed in computer cover 4. Upon alignment, a plurality of screws 3 are respectively inserted into the holes 21 formed in rear panel 2, and are then screwed into corresponding screw grooves 41 formed in computer cover 4, to thereby fasten rear panel 2 to computer cover 4. A cross-sectional view of this configuration in a connected state is shown in FIG. 2.

With this configuration, however, anyone possessing a standard screwdriver can readily disassemble computer cover 4 from rear panel 2 of the computer case and access the internal components of the computer. Accordingly, theft of the computer's internal components becomes a serious threat.

Figure 3:
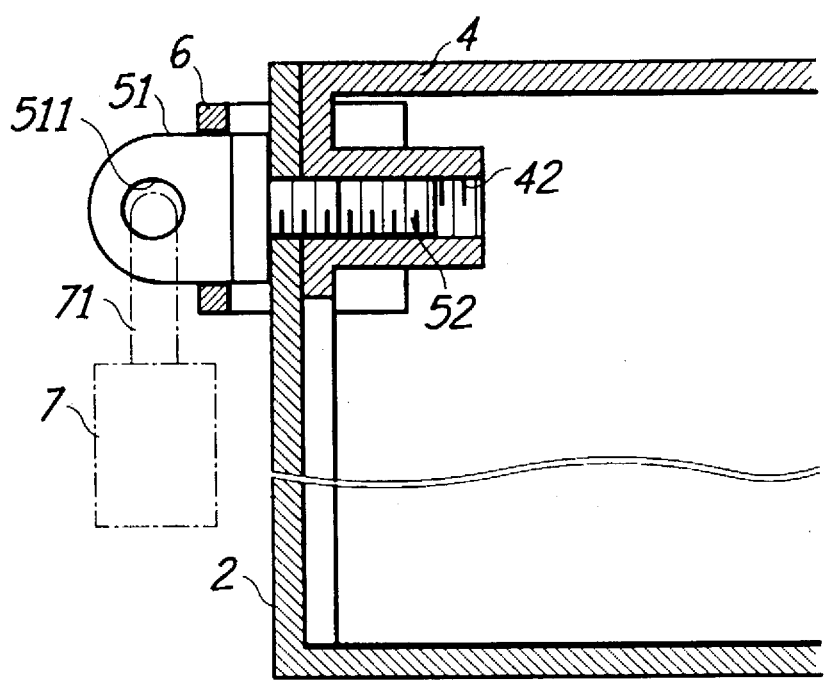
FIG. 3 illustrates a cross-sectional view of a burglar-proofing device for a personal computer constructed according to the principles of the present invention.
Figure 4:
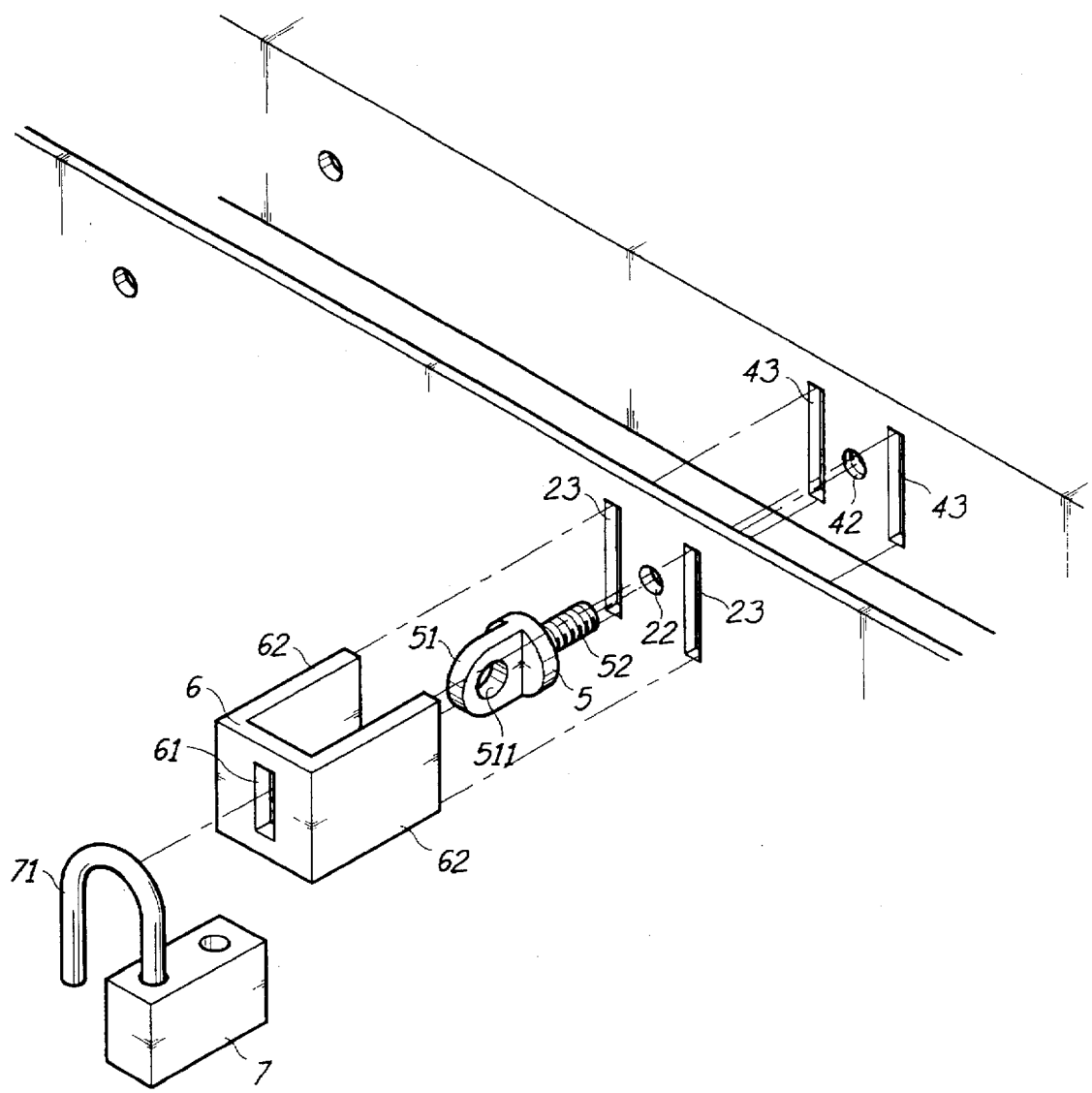
FIG. 4 illustrates an exploded perspective view of the burglar-proofing device for a personal computer constructed according to the principles of the present invention.
Figure 5:
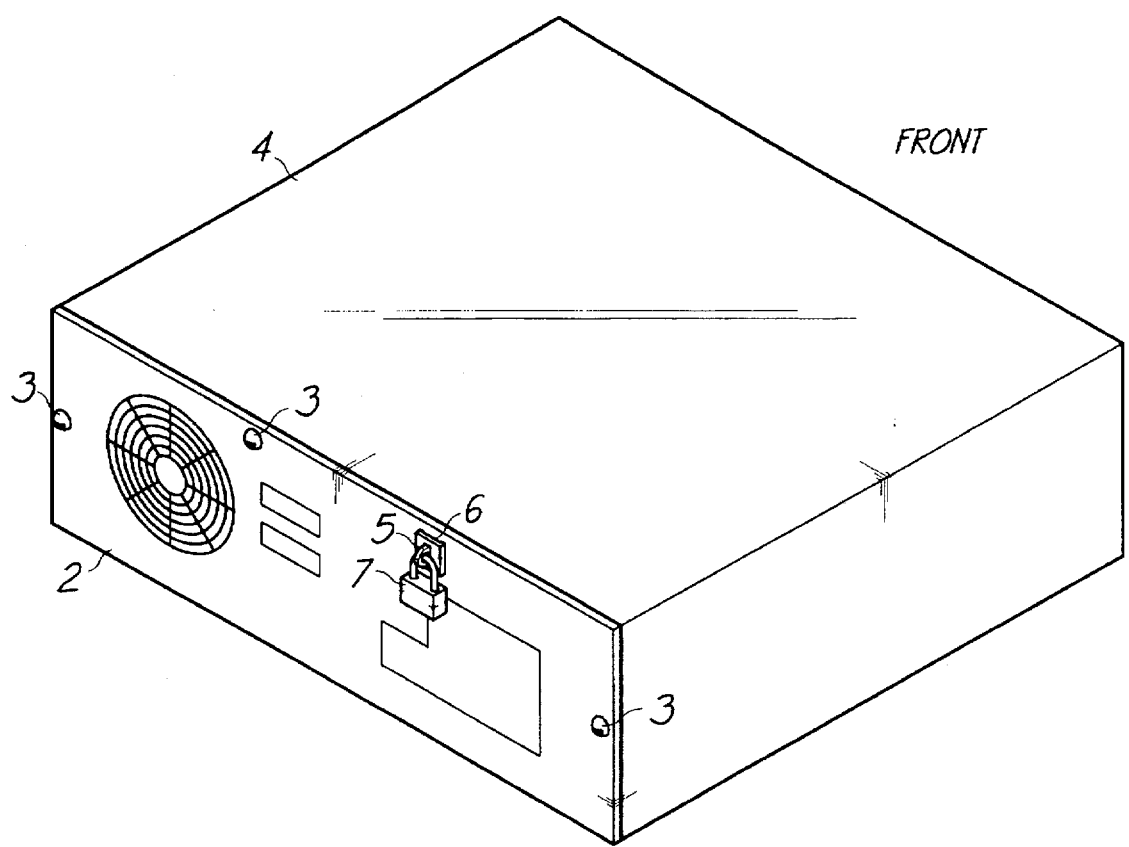
FIG. 5 illustrates the general configuration of the burglar-proofing device for a personal computer constructed according to the principles of the present invention.

Referring now to FIGS. 3 through 5, a burglar-proofing device for a personal computer constructed according to the principles of the present invention will be described.

As shown in FIG. 4, the burglar-proofing device of the present invention contemplates a computer cover 4 that is connectable to a rear panel 2 of a computer case. Upon proper alignment of computer cover 4 and rear panel 2, a first pair of guide grooves 23 and a hole 22 formed in rear panel 2 are arranged to spacially correspond to a second pair of guide grooves 43 and a female screw groove 42 formed in computer cover 4, respectively. To enable the connection between computer cover 4 and rear panel 2, a ring screw 5 having a projecting portion 51 formed on one end and a male threaded portion 52 formed on the other end is provided. Projecting portion 51 has a hole 511 formed therein. A bracket 6 includes a rectangular slot 61 formed in a center portion to accommodate insertion of projecting portion 51 of ring screw 5, and further includes a pair of arms 62 that are slidably insertable into first and second pairs of guide grooves 23 and 43. A lock 7 having a latching arm 71 is provided to secure the configuration in an assembled state. A cross-sectional view of this assembled state is shown in FIG. 3, and the general configuration of the burglar-proofing device in the assembled state is shown in FIG. 5.

Assembly of the burglar-proofing device of the present invention will now be described with reference to FIG. 4. Computer cover 4 and rear panel 2 are first placed against each other so that the first pair of guide grooves 23 are aligned with the second pair of grooves 43, and hole 22 is aligned with screw groove 42. In this aligned state, ring screw 5 is then inserted into hole 22 and rotated by hand, to thereby screw male threaded portion 52 of ring screw 5 into female screw groove 42.

Once threaded portion 52 of ring screw 5 is securely fastened within screw groove 42, arms 62 of bracket 6 are slidably inserted into first and second pairs of grooves 23 and 43. As the arms 62 are being inserted, projecting portion 51 simultaneously passes through rectangular slot 61 formed in bracket 6. Note that before bracket 6 is assembled, ring screw 5 must be rotational aligned so that projecting portion 51 can pass through rectangular slot 61. Next, latching arm 71 of lock 7 is inserted through hole 511 formed in projecting portion 51 of ring screw 5, and lock 7 is manually manipulated into a locked state. In this state, which is represented in FIGS. 3 and 5, access to the computer's internal components is prevented, unless a key to lock 7 is used.

To disassemble the configuration from the locked state, a user simply unlocks lock 7 using the key, and performs the above-mentioned steps in reverse order.

According to the present invention, when a computer cover is connected to a rear panel of a computer case, a lock is used to prevent anyone without a key from accessing the computer's internal components. Moreover, when an additional cable is used in this configuration, movement of the computer from a fixed position can be prevented.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiments disclosed as the best mode contemplated for carrying out the present invention, but that the present invention includes all embodiments falling within the scope of the appended claims.

What is claimed is:

1. A burglar proofing device, said device comprising:
   a housing for a computer having a rear panel with a first pair of grooves and a hole formed therein, and having a cover with a second pair of grooves and a fastening receptacle formed therein;
   a ring screw having a fastening portion formed on a first end and a projecting portion formed on a second end positioned opposite said first end, said fastening portion being connected within said fastening receptacle when said computer is in an assembled state;
   a bracket having a slot formed in a center portion and first and second arms extending outwardly from said center portion, said first arm being inserted through a first one of said first pair of grooves and a first one of said second pair of grooves, said second arm being inserted through a second one of said first pair of grooves and a second one of said second pair of grooves and said projecting portion being inserted through said slot when said computer is in said assembled state; and
   fixing means for securing said computer in said assembled state, said fastening portion of said ring screw comprises a male threaded fastening member and said fastening receptacle formed in said cover comprises a female threaded groove matingly engaging said fastening member.

2. The device as claimed in claim 1, further comprised of said projecting portion of said ring screw having a latching hole formed therein.

3. The device as claimed in claim 2, wherein said fixing means comprises a lock having a latching arm that is insertable through said latching hole formed in said projecting portion of said ring screw.

4. The device as claimed in claim 1, further comprised of said slot formed in said bracket having a rectangular shape for accommodating insertion of said projecting portion of said ring screw.

5. A burglar proofing device, said device comprising:
   a housing for a computer having a rear panel with a first pair of grooves and a hole formed therein, and having a cover with a second pair of grooves and a fastening receptacle formed therein;
   connecting means for connecting said rear panel to said cover, said connecting means having a fastening portion formed on a first end and a projecting portion formed on a second end positioned opposite said first end, said fastening portion being connected within said fastening receptacle when said computer is in an assembled state;
   a bracket having a rectangular slot formed in a center portion and first and second arms extending outwardly from said center portion, said first arm being inserted through a first one of said first pair of grooves and a first one of said second pair of grooves, said second arm being inserted through a second one of said first pair of grooves and a second one of said second pair of grooves and said projecting portion being inserted through said rectangular slot when said computer is in said assembled state; and
   a lock having a latching arm that is insertable through a recess formed in said projecting portion of said connecting means for securing said computer in said assembled state, said fastening portion of said connecting means comprises a threaded fastening member and said fastening receptacle formed in said cover comprises a threaded groove matingly engaging said threaded fastening member.

6. A method for assembling a burglar-proofing device for a computer, comprising the steps of:
   engaging a cover of said computer with a rear panel of said computer;
   aligning a first plurality of guide grooves and a hole formed in said rear panel respectively with a second plurality of guide grooves and a fastening receptacle formed in said cover;
   inserting a fastening portion of a connector through said hole formed in said rear panel, and connecting said fastening portion within said fastening receptacle formed in said cover;

installing a bracket to restrain said connector by simultaneously:
- inserting a first arm of said bracket through a first one of said first pair of grooves and a first one of said second pair of grooves;
- inserting a second arm of said bracket through a second one of said first pair of grooves and a second one of said second pair of grooves; and
- inserting a projecting portion of said connector through a slot formed in said bracket; and
- inserting a latching arm of a lock through a recess formed in said projecting portion of said connector.

7. The method as claimed in claim 6, further comprising a step of placing said lock in a locked state after insertion of said latching arm through said recess.

* * * * *